US009559196B2

(12) United States Patent
Nishikawa et al.

(10) Patent No.: US 9,559,196 B2
(45) Date of Patent: Jan. 31, 2017

(54) SEMICONDUCTOR WAFER, METHOD OF PRODUCING SEMICONDUCTOR WAFER, ELECTRONIC DEVICE, AND METHOD OF PRODUCING ELECTRONIC DEVICE

(71) Applicant: SUMITOMO CHEMICAL COMPANY, LIMITED, Chuo-ku, Tokyo (JP)

(72) Inventors: Naohiro Nishikawa, Ichihara (JP); Tsuyoshi Nakano, Sodegaura (JP); Takayuki Inoue, Toda (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 95 days.

(21) Appl. No.: 13/664,360

(22) Filed: Oct. 30, 2012

(65) Prior Publication Data

US 2013/0056794 A1 Mar. 7, 2013

Related U.S. Application Data

(63) Continuation-in-part of application No. PCT/JP2011/002344, filed on Apr. 21, 2011.

(30) Foreign Application Priority Data

Apr. 30, 2010 (JP) ................................ 2010-105694

(51) Int. Cl.
*H01L 29/778* (2006.01)
*H01L 27/085* (2006.01)
(Continued)

(52) U.S. Cl.
CPC ......... *H01L 29/7785* (2013.01); *H01L 27/085* (2013.01); *H01L 29/66462* (2013.01);
(Continued)

(58) Field of Classification Search
USPC ............ 257/190, E29.249, E21.403, E21.09; 438/478, 172
See application file for complete search history.

(56) References Cited

U.S. PATENT DOCUMENTS 5,216,261 A * 6/1993 Inata ..................... B82Y 20/00
257/15
5,332,451 A * 7/1994 Hata ................. H01L 21/02395
117/56
(Continued)

FOREIGN PATENT DOCUMENTS

JP   H1-196809      *  8/1989   ............. H01L 21/20
JP   02-257669 A      10/1990
(Continued)

OTHER PUBLICATIONS

Machine translation, Furuhata, Japanese Pat. Pub. No. H10-313096, translation date Feb. 7, 2014, JPO & Japio, all pages.*
(Continued)

*Primary Examiner* — Victoria K Hall
(74) *Attorney, Agent, or Firm* — Sughrue Mion, PLLC

(57) ABSTRACT

A semiconductor wafer includes a base wafer, a first semiconductor portion that is formed on the base wafer and includes a first channel layer containing a majority carrier of a first conductivity type, a separation layer that is formed over the first semiconductor portion and contains an impurity to create an impurity level deeper than the impurity level of the first semiconductor portion, and a second semiconductor portion that is formed over the separation layer and includes a second channel layer containing a majority carrier of a second conductivity type opposite to the first conductivity type.

18 Claims, 13 Drawing Sheets

(51) Int. Cl.
*H01L 29/66* (2006.01)
*H01L 29/812* (2006.01)
*H01L 21/02* (2006.01)
*H01L 29/207* (2006.01)

(52) U.S. Cl.
CPC ........ *H01L 29/812* (2013.01); *H01L 21/0262* (2013.01); *H01L 21/02463* (2013.01); *H01L 21/02505* (2013.01); *H01L 21/02543* (2013.01); *H01L 21/02546* (2013.01); *H01L 29/207* (2013.01)

(56) References Cited

U.S. PATENT DOCUMENTS

| | | | | |
|---|---|---|---|---|
| 5,410,167 | A | * | 4/1995 | Saito ................. H01L 21/02395 257/192 |
| 5,739,559 | A | * | 4/1998 | Kagaya ............... H01L 29/1075 257/192 |
| 5,844,303 | A | * | 12/1998 | Kikkawa ........... H01L 21/02381 257/190 |
| 9,450,053 | B2 | * | 9/2016 | Goyal ..................... H01L 29/15 |
| 2003/0080331 | A1 | * | 5/2003 | Ono .................... H01L 27/0605 257/14 |
| 2006/0255403 | A1 | * | 11/2006 | Asano ................. H01L 27/0605 257/335 |
| 2008/0217782 | A1 | * | 9/2008 | Frank ................ H01L 21/76898 257/755 |
| 2012/0025268 | A1 | * | 2/2012 | Ichikawa ............ H01L 21/8252 257/192 |
| 2013/0056794 | A1 | * | 3/2013 | Nishikawa et al. .......... 257/190 |

FOREIGN PATENT DOCUMENTS

| | | | | |
|---|---|---|---|---|
| JP | 06-208963 | A | | 7/1994 |
| JP | 06-275523 | A | | 9/1994 |
| JP | H6-275523 | | * | 9/1994 ............. H01L 21/20 |
| JP | 09-069611 | A | | 3/1997 |
| JP | 2691571 | B | | 12/1997 |
| JP | 10-313096 | A | | 11/1998 |
| JP | H10-313096 | | * | 11/1998 ............. H01L 27/06 |
| JP | 2002-334841 | A | | 11/2002 |
| JP | 2003-133561 | | * | 5/2003 ........... H01L 29/861 |
| JP | 2003-133561 | A | | 5/2003 |
| JP | 2003-142492 | | * | 5/2003 ........... H01L 21/331 |
| JP | 2008-060359 | A | | 3/2008 |
| WO | WO 2010/116700 | | * | 10/2010 ......... H01L 21/8222 |

OTHER PUBLICATIONS

Machine translation, Yoshikawa, Japanese Pat. Pub. No. H6-275523, translation date Feb. 7, 2014, JPO & Japio, all pages.*
Machine translation, Hata, Japanese Pat. Pub. No. H6-208963, translation date Feb. 7, 2014, JPO & Japio, all pages.*
Machine translation, Ono, Japanese Pat. Pub. No. 2003-133561, translation date Feb. 7, 2014, JPO & Japio, all pages.*
Machine translation, Tanaka, Japanese Pat. Pub. No. 2002-334841, translation date Feb. 7, 2014, JPO & Japio, all pages.*
Machine translation, Matsumoto, Japanese Pat. Pub. No. H9-69611, translation date Feb. 7, 2014, JPO & Japio, all pages.*
Machine translation, Yoshikawa, Japanese Pat. Pub. No. H6-275523, translation date: Feb. 12, 2015, Espacenet, all pages.*
Machine translation, Yoshikawa, Japanese Pat. Pub. No. H6-275523, translation date: Feb. 12, 2015, ProQuest, all pages.*
Abstract, Ohori, Japanese Pat. Pub. No. H1-196809, translation date: Aug. 22, 2015, Espacenet, all pages.*
Machine translation, Ono, Japanese Pat. Pub. No. 2003-133561, translation date: Aug. 22, 2015, Espacenet, all pages.*
English translation, Yoshikawa, Japanese Pat. Pub. No. H6-275523, translation date: Feb. 2015, Schreiber Translations, Inc., all pages.*
K. Yamanaka et al., Electron traps in AlGaAs grown by molecular-beam epitaxy, Journal of Applied Physics, vol. 61, No. 11, Jun. 1, 1987, pp. 5062-5069.*
English translation, Furuhata, Japanese Patent Publication No. H10-313096, translation date: Sep. 2015, Schreiber Translations, Inc., all pages.*
English translation, Ohori, Japanese Pat. Pub. No. H1-196809, translation date: Aug. 2015, Phoenix Translations, all pages.*
International Search Report of PCT/JP2011/002344 dated May 31, 2011.
International Preliminary Report on Patentability and Written Opinion issued Dec. 10, 2012 in International Application No. PCT/JP2011/002344.
Office Action issued on Feb. 3, 2015 in Japanese Patent Application No. 2011-094814.
Communication dated Nov. 23, 2015, issued by the Taiwan Patent Office in corresponding Taiwanese Application No. 100114604.
Communication dated Aug. 31, 2016, issued by the Taiwanese Intellectual Property Office in corresponding Taiwanese Application No. 100114604.

* cited by examiner

FIG. 10

| REFERENCE NUMBER | NAME | CRYSTAL LAYER | THICKNESS [nm] | IMPURITY CONCENTRATION [cm$^{-3}$] | DOPANT |
|---|---|---|---|---|---|
| 416 | CONTACT LAYER | p-GaAs | 10 | 5.0E+18 | C |
| 414 | SCHOTTKY LAYER | p-Al$_{0.2}$Ga$_{0.8}$As | 30 | 5.0E+16 | C |
| 412 | HOLE SUPPLY LAYER | p-Al$_{0.2}$Ga$_{0.8}$As | 5 | 2.0E+18 | C |
| 410 | SPACER LAYER | i-Al$_{0.2}$Ga$_{0.8}$As | 5 | – | – |
| 408 | SECOND CHANNEL LAYER | i-In$_{0.2}$Ga$_{0.8}$As | 10 | – | – |
| 406 | SPACER LAYER | i-Al$_{0.2}$Ga$_{0.8}$As | 5 | – | – |
| 404 | HOLE SUPPLY LAYER | p-Al$_{0.2}$Ga$_{0.8}$As | 5 | 1.0E+18 | C |
| 402 | BUFFER LAYER | i-Al$_{0.2}$Ga$_{0.8}$As | 100 | – | – |
| 300 | SEPARATION LAYER | Al$_{0.3}$Ga$_{0.7}$As:O | 300 | × | O |
| 310 | ETCH STOP LAYER | i-In$_{0.48}$Ga$_{0.52}$P | 5 | – | – |
| 216 | CONTACT LAYER | n-GaAs | 10 | 4.0E+18 | Si |
| 214 | SCHOTTKY LAYER | n-Al$_{0.2}$Ga$_{0.8}$As | 30 | 5.0E+16 | Si |
| 212 | ELECTRON SUPPLY LAYER | n-Al$_{0.2}$Ga$_{0.8}$As | 5 | 2.0E+18 | Si |
| 210 | SPACER LAYER | i-Al$_{0.2}$Ga$_{0.8}$As | 5 | – | – |
| 208 | FIRST CHANNEL LAYER | i-In$_{0.2}$Ga$_{0.8}$As | 10 | – | – |
| 206 | SPCAER LAYER | i-Al$_{0.2}$Ga$_{0.8}$As | 5 | – | – |
| 204 | ELECTRON SUPPLY LAYER | n-Al$_{0.2}$Ga$_{0.8}$As | 5 | 1.0E+18 | Si |
| 202 | BUFFER LAYER | i-Al$_{0.25}$Ga$_{0.75}$As | 200 | – | – |
| 110 | BASE WAFER | GaAs WAFER | – | – | – |

SECOND SEMICONDUCTOR PORTION 400: layers 416–402
FIRST SEMICONDUCTOR PORTION 200: layers 216–202

| REFERENCE NUMBER | NAME | CRYSTAL LAYER | THICKNESS [nm] | IMPURITY CONCENTRATION [cm$^{-3}$] | DOPANT |
|---|---|---|---|---|---|
| 416 | CONTACT LAYER | p-GaAs | 10 | 5.0E+18 | C |
| 414 | SCHOTTKY LAYER | p-Al$_{0.2}$Ga$_{0.8}$As | 30 | 5.0E+16 | C |
| 412 | HOLE SUPPLY LAYER | p-Al$_{0.2}$Ga$_{0.8}$As | 5 | 2.0E+18 | C |
| 410 | SPACER LAYER | i-Al$_{0.2}$Ga$_{0.8}$As | 5 | - | - |
| 408 | SECOND CHANNEL LAYER | i-In$_{0.2}$Ga$_{0.8}$As | 10 | - | - |
| 406 | SPACER LAYER | i-Al$_{0.2}$Ga$_{0.8}$As | 5 | - | - |
| 404 | HOLE SUPPLY LAYER | p-Al$_{0.2}$Ga$_{0.8}$As | 5 | 1.0E+18 | C |
| 402 | BUFFER LAYER | i-Al$_{0.2}$Ga$_{0.8}$As | 200 | - | - |
| 110 | BASE WAFER | GaAs WAFER | - | - | - |

*FIG.11*

| | IMPURITY CONCENTRATION X OF SEPARATION LAYER (cm$^{-3}$) | CONDUCTIVITY TYPE | SHEET CARRIER CONCENTRATION (ROOM TEMPERATURE) (cm$^{-2}$) | MOBILITY (ROOM TEMPERATURE) (cm$^2$/Vs) | SHEET CARRIER CONCENTRATION (77K) (cm$^{-2}$) | MOBILITY (77K) (cm$^2$/Vs) |
|---|---|---|---|---|---|---|
| SAMPLE 1 | 0 | n | 6.6E+12 | 2290 | 4.0E+12 | 4150 |
| SAMPLE 2 | 1.0E+19 | n | 3.4E+11 | 4050 | 2.5E+11 | 8950 |
| SAMPLE 3 | 2.0E+19 | | NOT MEASURABLE DUE TO HIGH RESISTANCE | | | |
| SAMPLE 4 | 4.0E+19 | p | 2.0E+12 | 330 | 2.8E+12 | 2580 |
| COMPARATIVE SAMPLE | — | p | 2.0E+12 | 350 | 2.7E+12 | 2720 |

FIG.12

| | IMPURITY CONCENTRATION X OF SEPARATION LAYER (cm$^{-3}$) | ELECTRON WITHSTANDING VOLTAGE (V) | ELECTRON LEAKAGE CURRENT (A) | HOLE WITHSTANDING VOLTAGE (V) | HOLE LEAKAGE CURRENT (A) |
|---|---|---|---|---|---|
| SAMPLE 1 | 0 | 5.4 | 8.8E-05 | 82.8 | 6.1E-09 |
| SAMPLE 2 | 1.0E+19 | 13.2 | 1.6E-06 | 79.2 | 5.8E-09 |
| SAMPLE 3 | 2.0E+19 | 25.4 | 5.7E-06 | 70.2 | 3.0E-09 |
| SAMPLE 4 | 4.0E+19 | 43.9 | 4.3E-08 | 97.5 | 1.6E-08 |

*FIG.14*

SEMICONDUCTOR WAFER, METHOD OF PRODUCING SEMICONDUCTOR WAFER, ELECTRONIC DEVICE, AND METHOD OF PRODUCING ELECTRONIC DEVICE

The contents of the following Japanese patent application and PCT patent application are incorporated herein by reference:
 JP 2010-105694 filed on Apr. 30, 2010, and
 PCT/JP2011/002344 filed on Apr. 21, 2011.

BACKGROUND

Technical Field

The present invention relates to a semiconductor wafer, a method of producing a semiconductor wafer, an electronic device, and a method of producing an electronic device.

Related Art

Japanese Patent Application Publication No. 10-313096 discloses a complementary semiconductor device in which an n-type field-effect transistor, an i-GaAs separation layer, and a p-type field-effect transistor are stacked on a GaAs wafer.

A complementary device having an n-type field-effect transistor and a p-type field-effect transistor formed on a single base wafer is expected to serve as an electronic device capable of achieving lower power consumption and high-speed operation.

In the conventional art, a p-GaAs layer is provided to be used as a contact layer under the layer in which the n-type field-effect transistor is formed. Since carriers are allowed to freely move in the p-GaAs layer, the carriers injected from the electrode provided on the contact layer of the p-type field-effect transistor move toward the n-type field-effect transistor through the p-GaAs layer. Consequently, leakage currents flow between the n-type field-effect transistor and the p-type field-effect transistor. This makes it difficult to increase the withstand voltage between the n-type field-effect transistor and the p-type field-effect transistor.

According to the invention disclosed in Japanese Patent Application Publication No. 10-313096, a buffer layer, a p-type channel layer, an i-type barrier layer, a separation layer, an n-type channel layer, an i-type barrier layer, and an n-type contact layer are formed by crystal growth in the stated order on a base wafer in a reaction chamber, and the resulting semiconductor wafer is then removed from the reaction chamber. Subsequently, the layers from the n-type contact layer to the separation layer of the removed semiconductor wafer are subjected to etching to expose a region in which the p-type field-effect transistor is to be formed. After this, the resulting semiconductor wafer is loaded into a reaction chamber to form by crystal growth p-GaAs on the surface of the i-type barrier layer. As described above, the semiconductor device disclosed in Japanese Patent Application Publication No. 10-313096 is produced in accordance with the method in which the semiconductor wafer is removed from the reaction chamber, further processed, placed back into the reaction chamber to perform further crystal growth. This method disadvantageously increases the cost of producing the semiconductor device.

SUMMARY

For a solution to the above-mentioned problems, according to the first aspect related to the present invention, provided is one exemplary semiconductor wafer including a base wafer, a first semiconductor portion that is formed on the base wafer and includes a first channel layer containing a majority carrier of a first conductivity type, a separation layer that is formed over the first semiconductor portion and contains an impurity to create an impurity level deeper than the impurity level of the first semiconductor portion, and a second semiconductor portion that is formed over the separation layer and includes a second channel layer containing a majority carrier of a second conductivity type opposite to the first conductivity type. For example, the separation layer contains impurity atoms the number of which is sufficient to allow the separation layer to trap all of the majority carriers of the first conductivity type in the first semiconductor portion.

In the above-described semiconductor wafer, the separation layer may have an electron trap center to trap electrons, where the center is lower than the boundary of the conduction band of the first semiconductor portion by 0.25 eV or more. Alternatively, the separation layer may have a hole trap center to trap holes, where the center is higher than the boundary of the valence band of the first semiconductor portion by 0.25 eV or more. For example, the separation layer contains an oxygen atom, a boron atom, a chromium atom or an iron atom. For example, the impurity concentration of the separation layer is less than $1 \times 10^{21}$ ($cm^{-3}$).

In the above-described semiconductor wafer, the first channel layer may contain electron carriers the number of which is larger than the total of the number of electron carriers contained in the second channel layer and the number of electron carriers contained in the separation layer, and the second channel layer may contain hole carriers the number of which is larger than the total of the number of hole carriers contained in the first channel layer and the number of hole carriers contained in the separation layer. For example, the base wafer of the above-described semiconductor wafer is made of GaAs, and the separation layer is made of $Al_yGa_{1-y}As$ ($0 \leq y \leq 1$) doped with an oxygen atom. In this case, the first channel layer and the second channel layer may be made of $In_zGa_{1-z}As$ ($0 \leq z \leq 1$).

The above-described semiconductor wafer may further include an etching stop layer that is formed between the separation layer and the first semiconductor portion and is configured such that the etching rate of the etching stop layer under a prescribed etching condition is lower than the etching rate of the separation layer. For example, the etching stop layer lattice-matches or pseudo lattice-matches the first semiconductor portion and the separation layer, and the separation layer lattice-matches or pseudo lattice-matches the second semiconductor portion. For example, the etching stop layer is made of $i-In_tGa_{1-t}P$ ($0 \leq t \leq 1$).

The first semiconductor portion may further include a first carrier supply layer containing an n-type impurity to supply the first channel layer with an electron, and the second semiconductor portion may further include a second carrier supply layer containing a p-type impurity to supply the second channel layer with a hole. In this case, the separation layer may contain carriers the number of which is larger than one of the number of n-type carriers in the first carrier supply layer and the number of p-type carriers in the second carrier supply layer.

For a solution to the above-mentioned problems, according to the second aspect related to the present invention, provided is one exemplary method of producing a semiconductor wafer, including forming, on a base wafer, a first semiconductor portion including a first channel layer containing a majority carrier of a first conductivity type, forming, over the first semiconductor portion, a separation layer containing an impurity to create an impurity level deeper than the impurity level of the first semiconductor portion, and forming, over the separation layer, a second semiconductor portion including a second channel layer containing a majority carrier of a second conductivity type opposite to the first conductivity type. The method may further include forming, over the first semiconductor portion, an etching stop layer that is configured such that the etching rate of the etching stop layer under a prescribed etching condition is lower than the etching rate of the separation layer.

For a solution to the above-mentioned problems, according to the third aspect related to the present invention, provided is one exemplary electronic device including a base wafer, a first semiconductor portion that is formed on the base wafer and includes a first channel layer containing a majority carrier of a first conductivity type, a separation layer that is formed in a partial region over the first semiconductor portion and contains an impurity to create an impurity level deeper than the impurity level of the first semiconductor portion, a second semiconductor portion that is formed over the separation layer and includes a second channel layer containing a majority carrier of a second conductivity type opposite to the first conductivity type, a source electrode, a gate electrode and a drain electrode formed in the first semiconductor portion, and a source electrode, a gate electrode and a drain electrode formed in the second semiconductor portion.

For a solution to the above-mentioned problems, according to the fourth aspect related to the present invention, provided is one exemplary method of producing an electronic device, including forming a mask to cover a partial region of the above-described semiconductor wafer, removing the second semiconductor portion by etching in a region other than a mask region in which the mask has been formed, forming a mask removed region by removing the mask, after the removal of the second semiconductor portion by the etching, forming a source electrode, a gate electrode and a drain electrode in the first semiconductor portion in the region other than the mask region, and forming a source electrode, a gate electrode and a drain electrode in the second semiconductor portion in the mask removed region.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 10 illustrates an exemplary semiconductor wafer 100 produced in order to confirm the characteristics of the semiconductor wafer 100 shown in FIG. 8.

FIG. 11 illustrates the structure of a p-type p-HHMT, which is separately produced, in order to be compared against the produced semiconductor wafer 100 in terms of characteristics.

FIG. 12 illustrates the measurements of the sheet carrier concentration and mobility of the produced sample semiconductor wafers.

FIG. 14 illustrates the measurements of the withstanding voltage and leakage currents obtained using two electrodes provided on a buffer layer 402.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
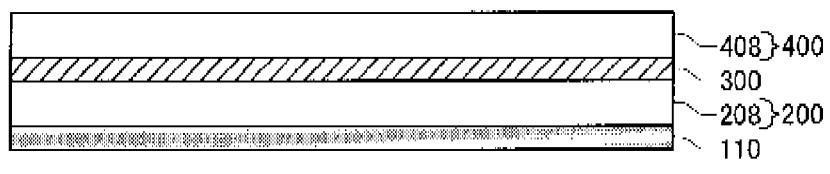
FIG. 1 illustrates an exemplary cross-section of a semiconductor wafer 100.

FIG. 1 illustrates an exemplary cross-section of a semiconductor wafer 100. The semiconductor wafer 100 includes a base wafer 110, a first semiconductor portion 200, a separation layer 300, and a second semiconductor portion 400. The first semiconductor portion 200 is formed on the base wafer 110. The separation layer 300 is formed over the first semiconductor portion 200. The second semiconductor portion 400 is formed over the separation layer 300.

The base wafer 110 is configured to support the first semiconductor portion 200, the separation layer 300 and the second semiconductor portion 400. For example, the base wafer 110 contains a Group 3-5 compound semiconductor. For example, the base wafer 110 is a GaAs wafer. The base wafer 110 may be obtained by forming a Group 3-5 compound semiconductor by epitaxial growth on one of an Si wafer, an SOI wafer, a Ge wafer and a GOI wafer.

The first semiconductor portion 200 includes a first channel layer 208 containing majority carriers of a first conductivity type. The majority carriers of the first conductivity type are either electrons or holes. For example, when the majority carriers of the first conductivity type are electrons, the first channel layer 208 is made of an n-type semiconductor. When the majority carriers of the first conductivity type are holes, the first channel layer 208 is made of a p-type semiconductor. When a field-effect transistor is formed in the semiconductor wafer 100, the first channel layer 208 serves as a channel allowing carriers to move therethrough between a source electrode and a drain electrode.

The second semiconductor portion 400 includes a second channel layer 408 containing majority carriers of a second conductivity type, which is opposite to the first conductivity type. For example, when the majority carriers of the first channel layer 208 are electrons, the majority carriers of the second channel layer 408 are holes. When the majority carriers of the first channel layer 208 are holes, the majority carriers of the second channel layer 408 are electrons.

When the first semiconductor portion 200 contains electrons as the majority carriers, an n-type p-HEMT (pseudomorphic-High Electron Mobility Transistor) can be formed in the first semiconductor portion 200, for example. When the second semiconductor portion 400 contains holes as the majority carriers, a p-type p-HHMT (pseudomorphic-High Hole Mobility Transistor) can be formed in the second semiconductor portion 400, for example. The n-type p-HEMT and the p-type p-HHMT can serve as complementary field-effect transistors.

The separation layer 300 contains impurities that establish an impurity level deeper than the impurity level of the first semiconductor portion 200. As such impurities, the separation layer 300 contains, for example, oxygen atoms, boron atoms, chromium atoms or iron atoms. If the separation layer 300 contains impurities, irregularity is found in the lattice arrangement of the separation layer 300. Consequently, the separation layer 300 traps the carriers moving from the first semiconductor portion 200 to the second semiconductor portion 400 to prevent the carriers from reaching the second semiconductor portion 400.

A Group 3-5 compound semiconductor containing As, a Group 3-5 compound semiconductor containing P, and Group 3-5 compound semiconductor containing N have impurities added thereto so that the donor level exists within the range of 0.20 eV from the conduction band. Alternatively, such compound semiconductors may have impurities added thereto so that the acceptor level exists within the range of 0.20 eV from the valance band. When the first semiconductor portion 200 contains electrons as carriers, the separation layer 300 can effectively trap the electrons moving from the first semiconductor portion 200 as long as the electron trap center of the separation layer 300 is deeper than the donor level. When the first semiconductor portion 200 contains holes as carriers, on the other hand, the separation layer 300 can effectively trap the holes moving from the first semiconductor portion 200 as long as the hole trap center of the separation layer 300 is deeper than the acceptor level.

If the electron trap center and the hole trap center are respectively shallower than the donor level and the acceptor level, the impurities may trap the carriers but the trapped carriers can be easily excited to become freely moving carriers. Accordingly, when the first semiconductor portion 200 contains electrons as the majority carriers, the electron trap center of the separation layer 300 to trap electrons is preferably lower than the boundary of the conduction band of the separation layer 300 by 0.25 eV or more. When the first semiconductor portion 200 contains holes as the majority carriers, the hole trap center of the separation layer 300 to trap holes is higher than the boundary of the valence band of the separation layer 300 by 0.25 eV or more.

When the base wafer 110 is made of GaAs, the first channel layer 208 and the second channel layer 408 are, for example, made of $In_zGa_{1-z}As$ ($0 \leq z \leq 1$). The first channel layer 208 and the second channel layer 408 may respectively have different values of z.

The separation layer 300 is, for example, made of $Al_yGa_{1-y}As$ ($0 \leq y \leq 1$) doped with oxygen atoms. The separation layer 300 has a composition so that the separation layer 300 may have substantially the same lattice spacing as the first semiconductor portion 200 and the second semiconductor portion 400 and contains impurities that create a deep level, for example, oxygen atoms, whereby the separation layer 300 lattice-matches or pseudo lattice-matches the first semiconductor portion 200 and the second semiconductor portion 400, and can prevent carriers from freely moving between the first semiconductor portion 200 and the second semiconductor portion 400.

As used herein, the term "pseudo lattice-matching" means that two abutting semiconductors do not have perfect lattice match but can be stacked without causing noticeable defects due to lattice mismatch since the two abutting semiconductors only have a small difference in lattice constant. In this case, the difference in lattice constant can be absorbed by the elastic deformation of the crystal lattices of the respective semiconductors. For example, Ge and GaAs pseudo lattice-match each other when stacked.

The separation layer 300 contains impurity atoms the number of which is determined to allow the separation layer 300 to trap all of the majority carriers of the first conductivity type in the first semiconductor portion 200. For example, when the first channel layer 208 contains electrons as the majority carriers, the first channel layer 208 contains a larger number of electron carriers than the total of the number of electron carriers contained in the second channel layer 408 and the number of electron carriers contained in the separation layer 300. The second channel layer 408 contains a larger number of hole carriers than the total of the number of hole carriers contained in the first channel layer 208 and the number of hole carriers contained in the separation layer 300.

The fact that the separation layer 300 contains impurity atoms in larger number than necessary to allow the separation layer 300 to trap all of the majority carriers contained in the first semiconductor portion 200 can result in a lower possibility of allowing the majority carriers contained in the first semiconductor portion 200 to reach the second semiconductor portion 400. However, if the separation layer 300 has a too high concentration of impurity atoms, defects may occur in the crystalline structure of the separation layer 300 and the separation layer 300 may neither lattice-match nor pseudo lattice-match the first semiconductor portion 200 and the second semiconductor portion 400. Considering these, for example, the concentration of the impurities in the separation layer 300 is preferably less than $1 \times 10^{21}$ (cm$^{-3}$).

Figure 2:
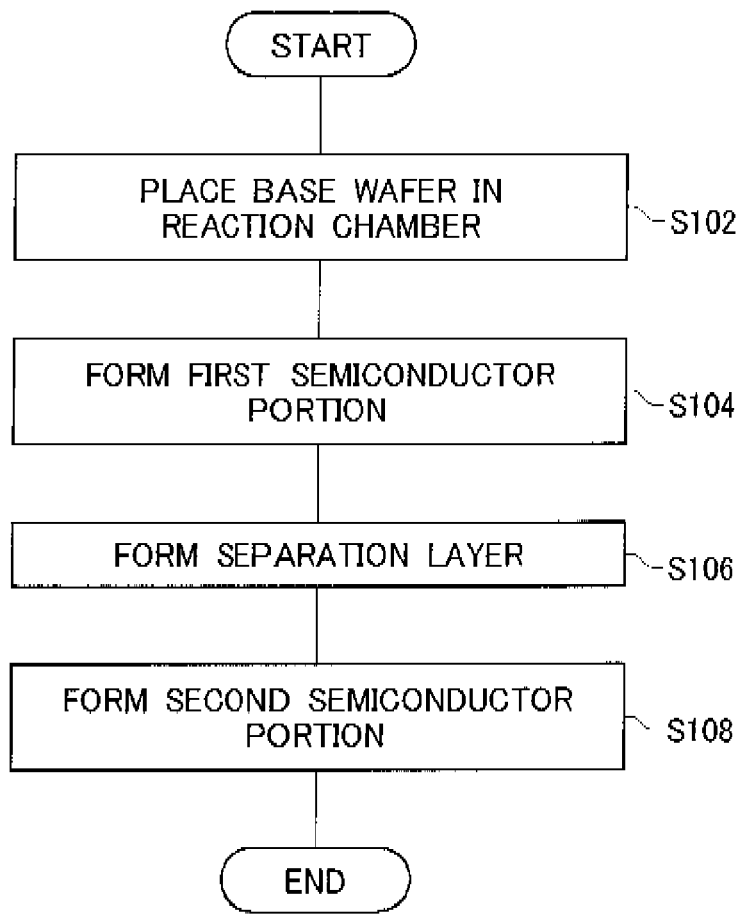
FIG. 2 is a flow chart illustrating a method of producing the semiconductor wafer 100.

FIG. 2 is a flow chart illustrating a method of producing the semiconductor wafer 100. In the step S102, the base wafer 110 is placed in a reaction chamber designed to form a semiconductor by crystal growth. Subsequently, in the step S104, the first semiconductor portion 200 is formed. In the step S104, for example, the first channel layer 208 is formed by epitaxial growth on the base wafer 110 using MOCVD.

The epitaxial growth using MOCVD can employ, as the Group 3 element source, trihydride or trialkyl compounds made up by metal atoms each of which is combined with hydrogen or an alkyl group with a carbon number of 1-3. For example, trimethylgallium (TMG), trimethylindium (TMI), and trimethylaluminum (TMA) can be used. As the Group 5 element source gas, arsine (AsH$_3$), alkyl arsine obtained by substituting at least one hydrogen atom of arsine with an alkyl group with a carbon number of 1-4, or phosphine (PH$_3$) can be used.

Subsequently, in the step S106, the separation layer 300 is formed. In the step S106, in addition to the Group 3 element source and the Group 5 element source, an element or a compound containing an impurity atom as a constituent is loaded into a reaction chamber. For example, when the separation layer 300 is made of $Al_yGa_{1-y}As$, trimethylgallium and trimethylaluminum as the Group 3 element source, arsine as the Group 5 element source gas, and a butylether gas containing oxygen atoms as a constituent are loaded into the reaction chamber and the base wafer 110 is heated. In this way, $Al_yGa_{1-y}As$ containing oxygen atoms as impurities can be formed by epitaxial growth. When chromium atoms or iron atoms are introduced into the separation layer 300 in the step S106, $Al_yGa_{1-y}As$ can be formed by epitaxial growth using molecular beam epitaxy (MBE).

Subsequently, in the step S108, the second semiconductor portion 400 is formed. In the step S108, for example, the second channel layer 408 is formed on the separation layer 300 by epitaxial growth using MOCVD. In the above-described manner, the semiconductor wafer 100 can be produced that has the first semiconductor portion 200 and the second semiconductor portion 400 separated from each other by the separation layer 300.

Figure 3:
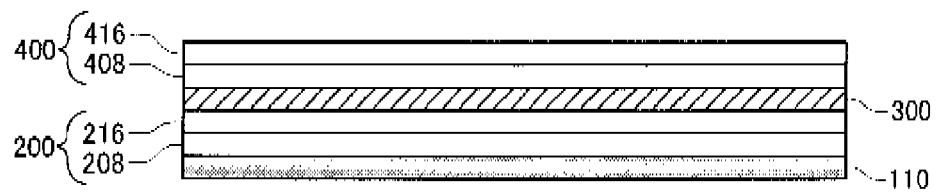
FIG. 3 illustrates an exemplary cross-section of a semiconductor wafer 100 relating to another embodiment.

FIG. 3 illustrates an exemplary cross-section of a semiconductor wafer 100 relating to another embodiment. In FIG. 3, the first semiconductor portion 200 additionally includes a contact layer 216 disposed over the first channel layer 208, when compared with the first semiconductor portion 200 shown in FIG. 1. The second semiconductor portion 400 additionally includes a contact layer 416 disposed over the second channel layer 408, when compared with the second semiconductor portion 400 shown in FIG. 1.

The contact layer 216 and the contact layer 416 establish conductivity between the electrodes to be provided when electronic elements such as field-effect transistors are formed in the semiconductor wafer 100 and the first and the second channel layers 208 and 408. For example, when the first channel layer 208 is made of i-InGaAs, the contact layer 216 is made of n-GaAs. When the second channel layer 408 is made of i-InGaAs, the contact layer 416 is made of p-GaAs.

Figure 4:
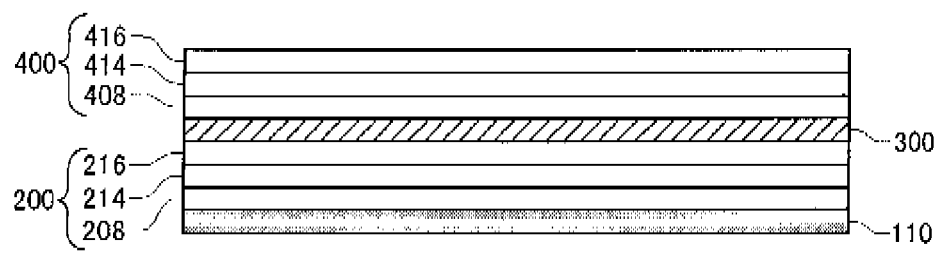
FIG. 4 illustrates an exemplary cross-section of a semiconductor wafer 100 relating to yet another embodiment.

FIG. 4 illustrates an exemplary cross-section of a semiconductor wafer 100 relating to yet another embodiment. The first semiconductor portion 200 shown in FIG. 4 additionally includes a Schottky layer 214, when compared with the first semiconductor portion 200 shown in FIG. 3. Furthermore, the second semiconductor portion 400 shown in FIG. 4 additionally includes a Schottky layer 414, when compared with the second semiconductor portion 400 shown in FIG. 3.

The Schottky layer 214 is sandwiched between the first channel layer 208 and the contact layer 216. The Schottky layer 414 is sandwiched between the second channel layer 408 and the contact layer 416.

Figure 5:
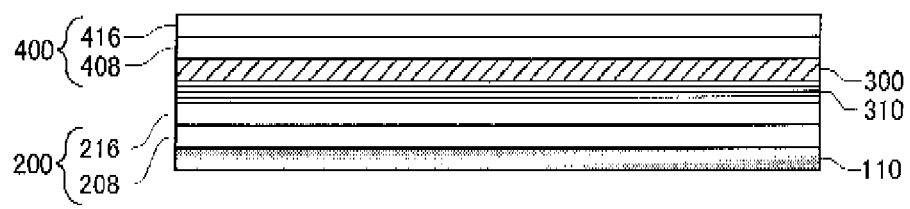
FIG. 5 illustrates an exemplary cross-section of a semiconductor wafer 100 relating to still yet another embodiment.

FIG. 5 illustrates an exemplary cross-section of a semiconductor wafer 100 relating to still yet another embodiment. The semiconductor wafer 100 shown in FIG. 5 additionally includes an etching stop layer 310, when compared with the semiconductor wafer 100 shown in FIG. 3. The etching stop layer 310 is sandwiched between the first semiconductor portion 200 and the separation layer 300.

The etching stop layer 310 is configured such that the etching rate of the etching stop layer 310 under prescribed etching conditions is lower than the etching rate of the separation layer 300. Since the semiconductor wafer 100 includes the etching stop layer 310, the first semiconductor portion 200 can be easily exposed by etching the second semiconductor portion 400 and the separation layer 300 under the above-mentioned etching conditions.

For example, when an n-type field-effect transistor is formed in the first semiconductor portion 200 and a p-type filed-effect transistor is formed in the second semiconductor portion 400, the surface of the first semiconductor portion 200 is exposed in the region in which the n-type field-effect transistor is to be formed. To expose the surface of the first semiconductor portion 200 in the region in which the n-type field-effect transistor is to be formed, the region in which the p-type field-effect transistor is to be formed is masked and the second semiconductor portion 400 and the separation layer 300 are removed by etching in the region other than the mask region. Forming source electrodes, gate electrodes, and drain electrodes on the exposed surface of the first semiconductor portion 200 and the surface of the second semiconductor portion 400 enables the first semiconductor portion 200 and the second semiconductor portion 400 to respectively serve as the channel of the n-type field-effect transistor and the channel of the p-type field-effect transistor.

Here, when the etching rate of the etching stop layer 310 is lower than the etching rate of the second semiconductor portion 400 and the separation layer 300, lower accuracy is required for the control of the etching conditions such as the duration of the etching during the etching of the second semiconductor portion 400 and the separation layer 300. This is because, even when the time spent to complete the etching of the second semiconductor portion 400 and the separation layer 300 is not controlled with high accuracy, the first semiconductor portion 200 can be prevented from being etched as long as the etching is terminated before the etching stop layer 310 is entirely removed by etching.

Only lower accuracy is required for the control of the etching conditions such as the duration of the etching during the etching of the etching stop layer 310, when the etching rate of the etching stop layer 310 is higher than the etching rate of the second semiconductor portion 400 and the separation layer 300 after the completion of the etching of the second semiconductor portion 400 and the separation layer 300. This is because, even when the time spent to complete the etching of the etching stop layer 310 is not controlled with high accuracy, the first semiconductor portion 200 can be prevented from being etched as long as the etching is terminated before the first semiconductor portion 200 starts to be etched.

The etching rate of the second semiconductor portion 400 and the separation layer 300 is preferably 10 times or more, more preferably 50 times or more, as high as the etching rate of the etching stop layer 310. For example, in the case where the second semiconductor portion 400 and the separation layer 300 are made of GaAs, the etching stop layer 310 is made of InGaP and etching is performed using phosphoric acid, the etching rate of InGaP is approximately one-hundredth of the etching rate of GaAs. In the case where the second semiconductor portion 400 and the separation layer 300 are made of InGaP, the etching stop layer 310 is made of GaAs, and etching is performed using hydrochloric acid, the etching rate of GaAs is approximately one three-hundredth of the etching rate of InGaP.

The etching stop layer 310 lattice-matches or pseudo lattice-matches the first semiconductor portion 200 and the separation layer 300, and the separation layer 300 lattice-matches or pseudo lattice-matches the second semiconductor portion 400. Specifically speaking, the lattice spacing of the etching stop layer 310 is substantially equal to the lattice spacing of the first semiconductor portion 200 and the lattice spacing of the separation layer 300. The lattice spacing of the separation layer 300 is substantially equal to the lattice spacing of the second semiconductor portion 400. When the first semiconductor portion 200 and the second semiconductor portion 400 contain AlGaAs, the etching stop layer 310 is, for example, made of $i-In_tGa_{1-t}P$ ($0 \leq t \leq 1$).

Figure 6:
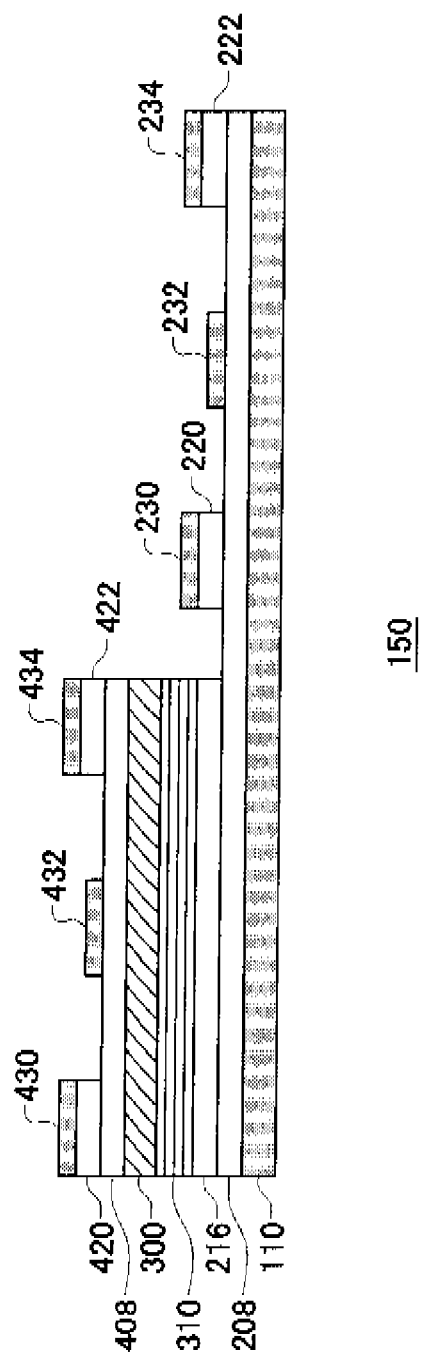
FIG. 6 illustrates an exemplary cross-section of an electronic device 150 obtained by forming complementary field-effect transistors on the semiconductor wafer 100.

FIG. 6 illustrates an exemplary cross-section of an electronic device 150 obtained by forming complementary field-effect transistors on the semiconductor wafer 100. Referring to the electronic device 150, the second semiconductor portion 400, the separation layer 300, and the etching stop layer 310 are removed by etching or the like in a partial region of the semiconductor wafer 100 shown in FIG. 5.

The electronic device 150 includes a contact 220 and a contact 222 on the first channel layer 208. The contact 220 and the contact 222 are formed by partially removing the contact layer 216 shown in FIG. 5.

The electronic device 150 also includes a source electrode 230 formed on the contact 220, a gate electrode 232 formed on the first channel layer 208, and a drain electrode 234 formed on the contact 222. The source electrode 230, the gate electrode 232, and the drain electrode 234 are control electrodes of an n-type field-effect transistor formed in the semiconductor wafer 100. The electrons injected by the source electrode 230 move through the first channel layer 208 serving as a channel to be collected by the drain electrode 234.

The electronic device 150 includes a contact 420 and a contact 422 formed on the second channel layer 408. The contact 420 and the contact 422 are formed by partially removing the contact layer 416 shown in FIG. 5.

The electronic device 150 also includes a source electrode 430 formed on the contact 420, a gate electrode 432 formed on the second channel layer 408, and a drain electrode 434 formed on the contact 422. The source electrode 430, the gate electrode 432, and the drain electrode 434 are control electrodes of a p-type field-effect transistor formed in the semiconductor wafer 100. The holes injected by the source electrode 430 move through the second channel layer 408 serving as a channel to be collected by the drain electrode 434.

Figure 7:
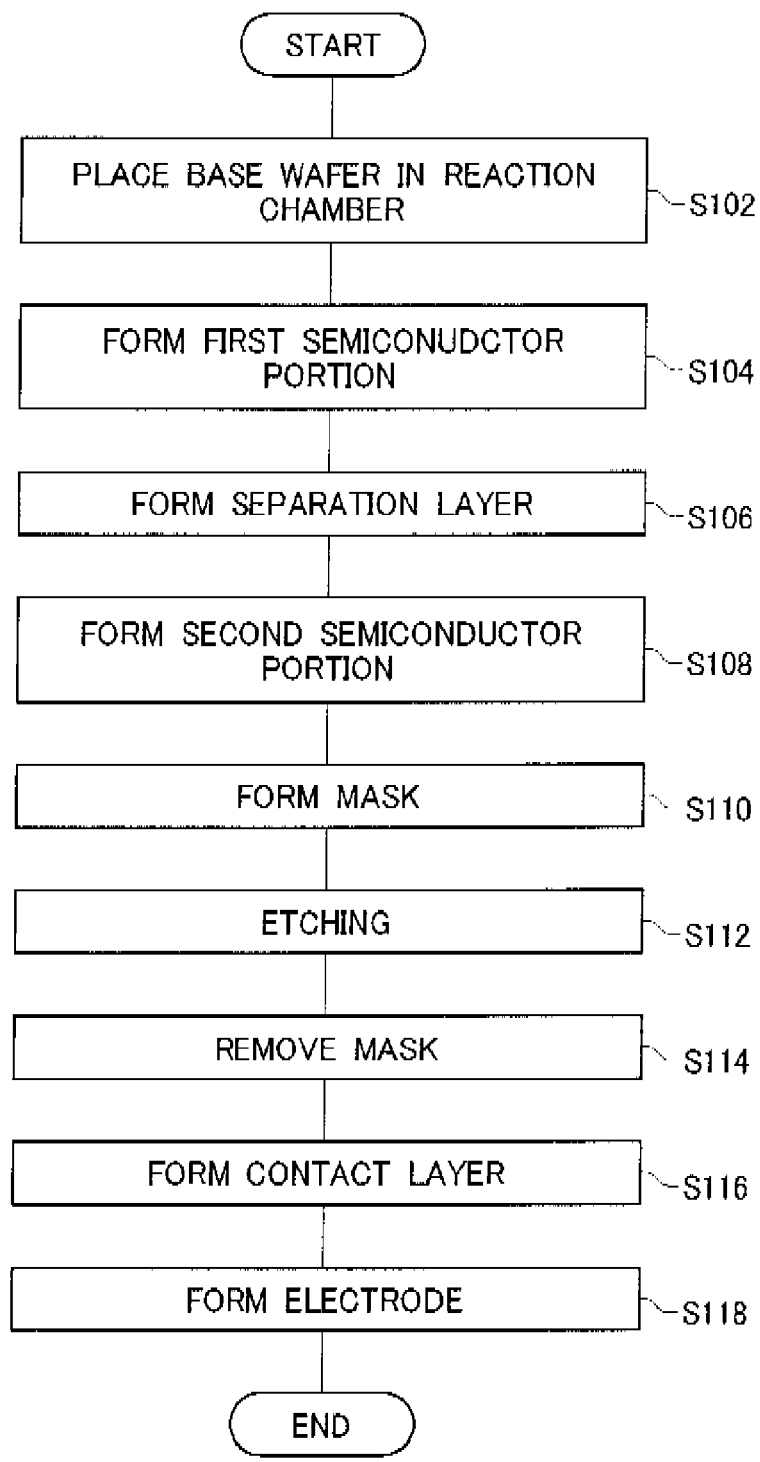
FIG. 7 is a flow chart to illustrate a method of producing the electronic device 150.

FIG. 7 is a flow chart to illustrate a method of producing the electronic device 150. The steps from S102 to S108 are the same as the steps from S102 to S108 shown in FIG. 2. By performing the steps from S102 to S108, the semiconductor wafer 100 is produced. Subsequently, in the step S110 of forming a mask to cover a partial region of the semiconductor wafer 100, the mask is formed in a region in which the second semiconductor portion 400, the separation layer 300 and the etching stop layer 310 remain. In other words, a resist or the like is applied to mask the region in which the p-type field-effect transistor is to be formed.

Subsequently, in the step S112 of etching, the second semiconductor portion 400, the separation layer 300 and the etching stop layer 310 are removed by etching in the region in which the n-type field-effect transistor is to be formed, in other words, in the region other than the region in which the mask is formed in the step S110. The second semiconductor portion 400, the separation layer 300 and the etching stop layer 310 are not removed in the mask region in which the mask is formed in the step S110.

The second semiconductor portion 400 and the separation layer 300 are etched under different conditions than the etching stop layer 310. For example, the second semiconductor portion 400 and the separation layer 300 are preferably etched at a higher rate than the etching stop layer 310.

Subsequently, in the step S114 of removing the mask, the mask that has been formed in the region in which the p-type field-effect transistor is to be formed is removed, so that a mask-removed region is formed. The mask can be removed using a resist stripping solution or the like.

Subsequently, in the step S116 of forming the contact layer, the contact 220 and the contact 222 are formed by removing a partial region of the contact layer 216. Additionally, the contact 420 and the contact 422 are formed by removing a partial region of the contact layer 416. Specifically speaking, etching is performed after a resist is applied in the regions in which the contacts 220, 222, 420 and 422 are to be formed, so that the contact layers 216 and 416 can be removed excluding the regions in which the contacts 220, 222, 420 and 422 are to be formed.

Lastly, in the step S118 of forming electrodes, the source electrode 230, the gate electrode 232, and the drain electrode 234 are respectively formed on the contact 220, the first channel layer 208 and the contact 222, in the region other than the mask region. Similarly, the source electrode 430, the gate electrode 432, and the drain electrode 434 are respectively formed on the contact 420, the second channel layer 408 and the contact 422 in the mask removed region. The source electrode 230, the gate electrode 232, the drain electrode 234, the source electrode 430, the gate electrode 432, and the drain electrode 434 are, for example, formed by metal evaporation.

Figure 8:
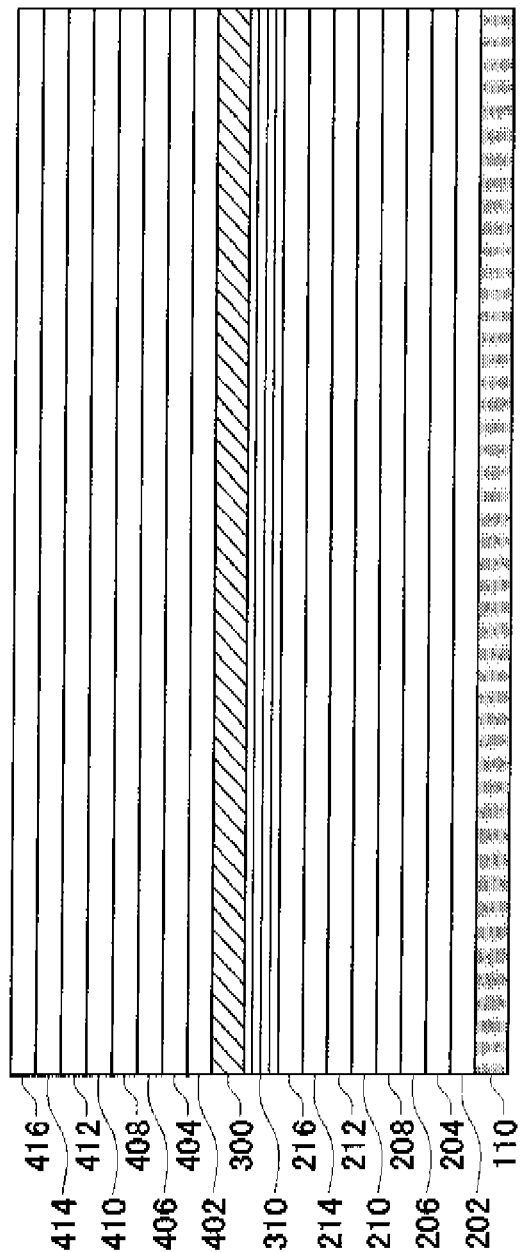
FIG. 8 illustrates an exemplary cross-section of a semiconductor wafer 100 relating to further another embodiment.

FIG. 8 illustrates an exemplary cross-section of a semiconductor wafer 100 relating to further another embodiment. The semiconductor wafer 100 shown in FIG. 8 additionally includes, when compared with the semiconductor wafer 100 shown in FIG. 5, a buffer layer 202, an electron supply layer 204, a spacer layer 206, a spacer layer 210, an electron supply layer 212, a Schottky layer 214, a buffer layer 402, a hole supply layer 404, a spacer layer 406, a spacer layer 410, a hole supply layer 412, and a Schottky layer 414.

The buffer layer 202 is a semiconductor layer designed to establish match in lattice spacing between the base wafer 110 and the electron supply layer 204. The buffer layer 202 may be a semiconductor layer designed to assure the crystallinity of the electron supply layer 204. The buffer layer 202 is, for example, formed on the base wafer 110 by epitaxial growth. The buffer layer 202 is, for example, made of GaAs or AlGaAs.

The electron supply layer 204 and the electron supply layer 212 are made of a semiconductor to supply the first channel layer 208 with carriers. When the first channel layer 208 is used as the channel of an n-type field-effect transistor, the electron supply layer 204 and the electron supply layer 212 contain, for example, impurities that impart the n-type conductivity to a semiconductor. For example, the electron supply layer 204 and the electron supply layer 212 contain silicon atoms.

The spacer layer 206 and the spacer layer 210 are respectively sandwiched between the electron supply layer 204 and the first channel layer 208, and between the electron supply layer 212 and the first channel layer 208. The spacer layer 206 and the spacer layer 210 prevent the impurities contained in the electron supply layer 204 and the electron supply layer 212 from moving into the first channel layer 208. Furthermore, the spacer layer 206 and the spacer layer 210 prevent the degradation in the mobility of the carriers in the first channel layer 208 that may be caused by scattering of impurity ions. The spacer layer 206 and the spacer layer 210 are, for example, made of AlGaAs.

The buffer layer 402 is a semiconductor layer designed to establish match in lattice spacing between the separation layer 300 and the hole supply layer 404. The buffer layer 402 may be a semiconductor layer designed to assure the crystallinity of the hole supply layer 404. The buffer layer 402 is, for example, formed on the separation layer 300 by epitaxial growth. The buffer layer 402 is, for example, made of GaAs or AlGaAs.

The hole supply layer 404 and the hole supply layer 412 are made of a semiconductor to supply the second channel layer 408 with carriers. When the second channel layer 408 is used as the channel of a p-type field-effect transistor, the hole supply layer 404 and the hole supply layer 412 contain, for example, impurities that impart the p-type conductivity to a semiconductor. For example, the hole supply layer 404 and the hole supply layer 412 contain carbon atoms.

The spacer layer 406 and the spacer layer 410 are respectively sandwiched between the hole supply layer 404 and the second channel layer 408, and between the hole supply layer 412 and the second channel layer 408. The spacer layer 406 and the spacer layer 410 prevent the impurities contained in the hole supply layer 404 and the hole supply layer 412 from moving into the second channel layer 408. Furthermore, the spacer layer 406 and the spacer layer 410 prevent the degradation in the mobility of the carriers in the second channel layer 408 that may be caused by scattering of impurity ions. The spacer layer 406 and the spacer layer 410 are, for example, made of AlGaAs.

Referring to the semiconductor wafer 100 shown in FIG. 8, the separation layer 300 contains carriers the number of which is larger than one of the number of the electron carriers in the electron supply layer 204 and the number of hole carriers in the electron supply layer 212. The separation layer 300 requires impurity atoms in larger number than necessary to allow the separation layer 300 to trap all of the majority carriers of the first conductivity type in the first semiconductor portion 200.

Figure 9:
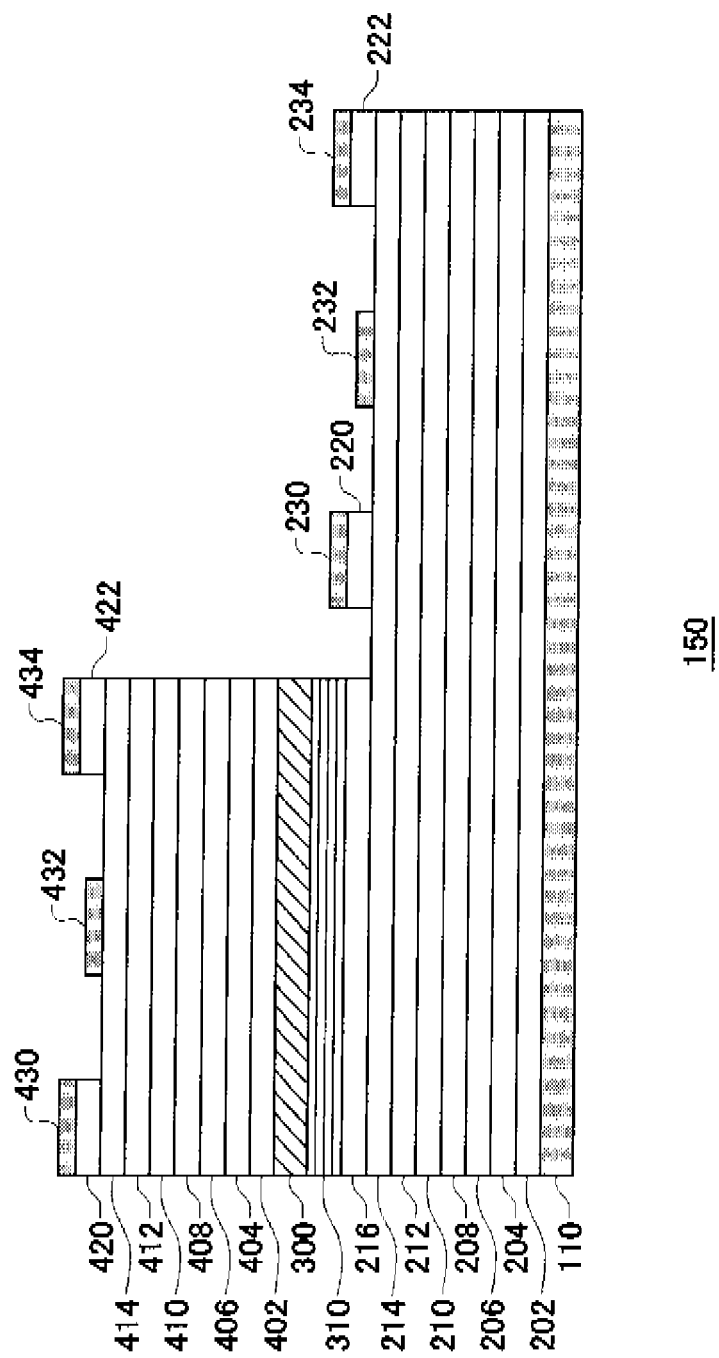
FIG. 9 illustrates an electronic device 150 obtained by forming complementary field-effect transistors using the semiconductor wafer 100 shown in FIG. 8.

FIG. 9 illustrates an electronic device 150 obtained by forming complementary field-effect transistors using the semiconductor wafer 100 shown in FIG. 8. The electronic device 150 shown in FIG. 9 is different from the electronic device 150 shown in FIG. 6 in terms of the layered structures of the first semiconductor portion 200 and the second semiconductor portion 400.

To produce the electronic device 150 shown in FIG. 9, in the step S112 of etching described with reference to FIG. 7, the layers from the contact layer 416 to the etching stop layer 310 are removed in the region of the semiconductor wafer 100 shown in FIG. 8, in which the n-type field-effect transistor is to be formed. The layers from the contact layer 416 to the etching stop layer 310 can be removed without the need of controlling the duration of the etching with high accuracy by removing the layers from the contact layer 416 to the separation layer 300 under a first etching condition and removing the etching stop layer 310 under a second etching condition.

After this, in accordance with the similar procedure as in producing the electronic device 150 shown in FIG. 6, the contact 220, the contact 222, the contact 420 and the contact 422 are formed. In addition, the source electrode 230, the gate electrode 232, the drain electrode 234, the source electrode 430, the gate electrode 432 and the drain electrode 434 are formed. By following the above-described procedure, an electronic device can be produced that has a p-type field-effect transistor and an n-type field-effect transistor formed on a single semiconductor wafer 100 with it being possible to reduce the leakage currents flowing between the field-effect transistors.

Exemplary Embodiments

Exemplary Experiment 1

FIG. 10 illustrates an exemplary semiconductor wafer 100 produced in order to confirm the characteristics of the semiconductor wafer 100 shown in FIG. 8. The semiconductor wafer 100 shown in FIG. 10 has a similar structure as the semiconductor wafer 100 shown in FIG. 8. FIG. 11 illustrates the structure of a p-type p-HHMT, which is separately produced, in order to be compared against the produced semiconductor wafer 100 in terms of characteristics. This experiment is designed to judge whether the sheet carrier concentration and mobility of the second channel layer 408 of the semiconductor wafer 100 have similar characteristics as the comparative sample p-type p-HHMT that is separately produced. The following describes the procedure of producing the semiconductor wafer 100 used in the experiment.

To begin with, a GaAs base wafer 110 was placed within a reaction chamber. Subsequently, layers from a buffer layer 202 to a contact layer 216 were sequentially formed by epitaxial growth using MOCVD. Following this, an etching stop layer 310 made of i-InGaP was formed on the contact layer 216 by epitaxial growth. As shown in FIG. 10, the epitaxial growth conditions for the respective layers were adjusted in order to achieve different compositions, thicknesses and impurity concentrations depending on the functions of the respective layers.

After this, trimethylgallium, trimethylaluminum, arsine and a butylether gas were introduced into the reaction chamber and the base wafer 110 was heated, so that a separation layer 300 made of AlGaAs containing oxygen atoms was formed by epitaxial growth on the etching stop layer 310. After the separation layer 300 was formed by epitaxial growth, layers from a buffer layer 402 to a contact layer 416 were sequentially formed by epitaxial growth.

In this experiment, a plurality of sample semiconductor wafers 100 were produced that differ from each other in oxygen atom concentration in the separation layer 300 and the characteristics of the semiconductor wafers 100 were measured in association with the different oxygen atom concentrations. Specifically speaking, the produced sample semiconductor wafers 1, 2, 3 and 4 respectively had oxygen atom concentrations of 0 ($cm^{-3}$), $1.0\times10^{19}$ ($cm^{-3}$), $2.0\times10^{19}$ ($cm^{-3}$) and $4.0\times10^{19}$ ($cm^{-3}$) in the separation layer 300.

The produced semiconductor wafers 100 were subjected to Hall effect measurement to determine the sheet carrier concentration and mobility of the second channel layer 408. Prior to the measurement, the contact layer 416 was removed by means of etching using citric acid, to expose the surface of the Schottky layer 414. A 7-mm-square sample was cut out from the resulting semiconductor wafer, In electrodes were formed on the four corners of one of the surfaces of the sample, and the Hall effect measurement was performed using the van der Pauw method.

FIG. 12 illustrates the measurements of the sheet carrier concentration and mobility of the second channel layers 408 of the produced sample semiconductor wafers. Regarding the sample semiconductor wafers 1 and 2, the n-type conductivity was observed. Regarding the sample semiconductor wafers 1 and 2, it is believed that the oxygen atom concentration of the separation layer 300 was not sufficiently high and some of the electrons in the first semiconductor portion 200, in which the n-type p-HEMT is to be formed, thus passed through the separation layer 300. It is also believed that some of the electrons that passed through the separation layer 300 compensated for all of the holes in the second semiconductor portion 400, in which the p-type p-HHMT is to be formed, and that the remaining electrons moved through the second channel layer 408.

Regarding the sample semiconductor wafer 3, it is believed that some of the electrons in the first semiconductor portion 200, which is constituted by the layers from the buffer layer 202 to the contact layer 216, passed through the separation layer 300 and that some of the electrons that passed through the separation layer 300 compensated for all of the holes in the second semiconductor portion 400. It is believed that, as a result of this, neither electrons nor holes were present in the second channel layer 408 and that the resistance became too high to be measured.

As discussed above, the holes have difficulties in moving at a high speed within the second channel layer 408 in the sample semiconductor wafers 1, 2 and 3. Consequently, it is believed that, if the separation layer 300 of the semiconductor wafer 100 has an oxygen atom concentration equal to the oxygen atom concentrations used in the separation layers 300 of the sample semiconductor wafers 1, 2, and 3, the second semiconductor portion 400 of the semiconductor wafer 100 is not suitably used to form a p-type p-HHMT.

On the contrary, the p-type conductivity is observed for the sample semiconductor wafer 4. It is believed that the electrons that moved from the first semiconductor portion 200 to the second semiconductor portion 400 were trapped by the separation layer 300 and that the holes thus remained in the second channel layer 408. Comparing the sheet carrier concentration and mobility of the sample semiconductor wafer 4 against the sheet carrier concentration and mobility of the comparative sample p-type p-HHMT reveals that they exhibit substantially the same values. Accordingly, it is proved that, due to the fact that the separation layer 300 has a sufficiently high concentration of oxygen atoms, the sample semiconductor wafer 4 is suitably used to form an n-type p-HEMT and a p-type p-HHMT therein.

Exemplary Experiment 2

Figure 13:
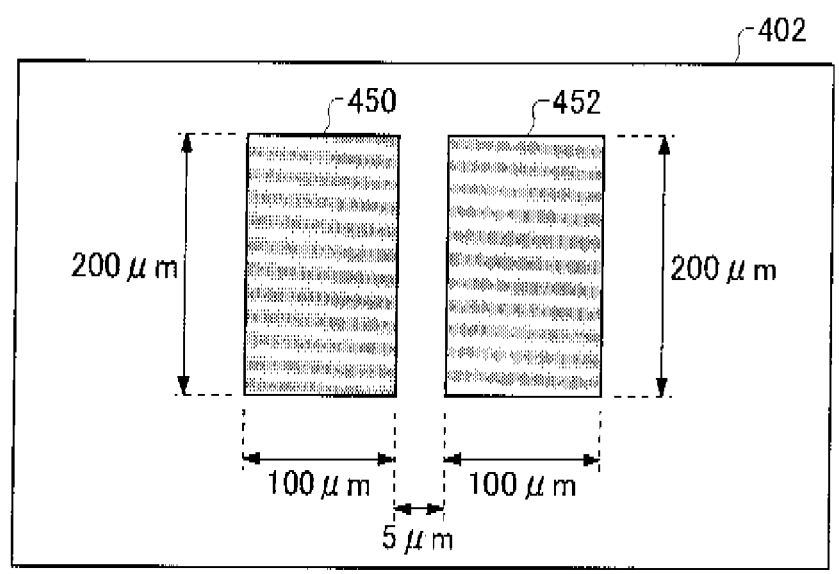
FIG. 13 illustrates the shapes of an electrode 450 and an electrode 452 provided on a Schottky layer 414.

The layers from the contact layer 416 to the hole supply layer 404 were removed by etching from the semiconductor wafers 100 produced in the exemplary experiment 1 to expose the surface of the buffer layer 402. FIG. 13 illustrates the shapes of an electrode 450 and an electrode 452 provided on the buffer layer 402. The electrodes 450 and 452 are metal electrodes formed by sequentially evaporating layers of AuGe, Ni, and Au to the thickness of 10 nm, 10 nm and 100 nm respectively, on the surface of the buffer layer 402.

FIG. 14 illustrates the measurements of the withstanding voltage and leakage currents obtained using the two electrodes provided on the buffer layer 402. The withstanding voltage of the semiconductor wafer 100 in the case where electrons were injected was measured by measuring the voltage between the two electrodes observed when currents of $1.0 \times 10^{-5}$ (A) was created by the flow of electrons between the two electrodes. The electrons injected from one of the two electrodes are trapped by the oxygen atoms in the separation layer 300. As a result of this, FIG. 14 indicates that, as the oxygen atom concentration of the separation layer 300 increases, the withstanding voltage of the semiconductor wafer 100 accordingly increases.

Furthermore, the leakage currents that may occur in the semiconductor wafer 100 when electrons were injected were measured by measuring the currents flowing between the electrodes when a voltage of 10 V was applied between the two electrodes. FIG. 14 indicates that, as the oxygen atom concentration of the separation layer 300 increases, the leakage currents of the semiconductor wafer 100 decrease.

Furthermore, the withstanding voltage of the semiconductor wafer 100 in the case where holes flowed was measured by measuring the voltage between the electrodes observed when currents of $1.0 \times 10^{-5}$ (A) are created by the flow of holes between the two electrodes. Since the holes injected from one of the electrodes are compensated for by the first semiconductor portion 200, which is positioned between the separation layer 300 and the base wafer 110, the injected holes do not reach the other electrode. As a result of this, the withstanding voltage observed when holes are injected is higher than the withstanding voltage observed when electrons are injected. In addition, the leakage currents observed when holes are injected are lower than the leakage currents observed when electrons are injected. Note that the withstanding voltage observed when holes are injected is less correlated to the oxygen atom concentration of the separation layer 300 than the withstanding voltage observed when electrons are injected.

While the embodiments of the present invention have been described, the technical scope of the invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:
1. A semiconductor wafer comprising:
a base wafer;
a first semiconductor portion that is formed on the base wafer and includes a first channel layer containing a majority carrier of a first conductivity type;
a separation layer that is formed over the first semiconductor portion and has (i) an electron trap center to trap electrons, the electron trap center being lower than a boundary of a conduction band of the separation layer by 0.25 eV or more, and (ii) a hole trap center to trap holes, the hole trap center being higher than a boundary of a valence band of the separation layer by 0.25 eV or more; and
a second semiconductor portion that is formed over the separation layer and includes a second channel layer containing a majority carrier of a second conductivity type opposite to the first conductivity type, wherein
the electron trap center and the hole trap center are formed by doping the separation layer with a butylether gas containing an oxygen atom.

2. The semiconductor wafer as set forth in claim 1, wherein
the separation layer contains impurity atoms a number of which is sufficient to allow the separation layer to trap all of the majority carriers of the first conductivity type in the first semiconductor portion.

3. The semiconductor wafer as set forth in claim 2, wherein
the base wafer is made of GaAs, and
the separation layer is made of $Al_yGa_{1-y}As$ ($0 \leq y \leq 1$) doped with an oxygen atom.

4. The semiconductor wafer as set forth in claim 3, wherein
the first channel layer and the second channel layer are made of $In_zGa_{1-z}As$ ($0 \leq z \leq 1$).

5. The semiconductor wafer as set forth in claim 1, wherein an impurity concentration of the separation layer is less than $1 \times 10^{21}$ (cm-3).

6. The semiconductor wafer as set forth in claim 1, wherein
the separation layer contains an oxygen atom, a boron atom, a chromium atom or an iron atom.

7. The semiconductor wafer as set forth in claim 1, wherein
the first channel layer contains electron carriers the number of which is larger than the total of the number of electron carriers contained in the second channel layer and the number of electron carriers contained in the separation layer, and
the second channel layer contains hole carriers the number of which is larger than the total of the number of hole carriers contained in the first channel layer and the number of hole carriers contained in the separation layer.

8. The semiconductor wafer as set forth in claim 1, further comprising
an etching stop layer that is formed between the separation layer and the first semiconductor portion and is configured such that the etching rate of the etching stop layer under a prescribed etching condition is lower than the etching rate of the separation layer.

9. The semiconductor wafer as set forth in claim 8, wherein
the etching stop layer lattice-matches or pseudo lattice-matches the first semiconductor portion and the separation layer, and the separation layer lattice-matches or pseudo lattice-matches the second semiconductor portion.

10. The semiconductor wafer as set forth in claim 8, wherein
the etching stop layer is made of i-IntGa1-tP ($0 \leq t \leq 1$).

11. The semiconductor wafer as set forth in claim 1, wherein
the first semiconductor portion further includes a first carrier supply layer containing an n-type impurity to supply the first channel layer with an electron,
the second semiconductor portion further includes a second carrier supply layer containing a p-type impurity to supply the second channel layer with a hole, and
the separation layer contains carriers the number of which is larger than one of the number of n-type carriers in the first carrier supply layer and the number of p-type carriers in the second carrier supply layer.

12. An electronic device comprising:
a base wafer;
a first semiconductor portion that is formed on the base wafer and includes a first channel layer containing a majority carrier of a first conductivity type;
a separation layer that is formed in a partial region over the first semiconductor portion and has (i) an electron trap center to trap electrons, the electron trap center being lower than a boundary of a conduction band of the separation layer by 0.25 eV or more, and (ii) a hole trap center to trap holes, the hole trap center being higher than a boundary of a valence band of the separation layer by 0.25 eV or more;
a second semiconductor portion that is formed over the separation layer and includes a second channel layer containing a majority carrier of a second conductivity type opposite to the first conductivity type;
a source electrode, a gate electrode and a drain electrode formed in the first semiconductor portion; and
a source electrode, a gate electrode and a drain electrode formed in the second semiconductor portion, wherein
the electron trap center and the hole trap center are formed by doping the separation layer with a butylether gas containing an oxygen atom.

13. A method of producing an electronic device, comprising:
forming a mask to cover a partial region of the semiconductor wafer as set forth in claim 1;
removing the second semiconductor portion by etching in a region other than a mask region in which the mask has been formed;
forming a mask removed region by removing the mask, after the removal of the second semiconductor portion by the etching;
forming a source electrode, a gate electrode and a drain electrode in the first semiconductor portion in the region other than the mask region; and
forming a source electrode, a gate electrode and a drain electrode in the second semiconductor portion in the mask removed region.

14. A method of producing a semiconductor wafer, comprising:
forming, on a base wafer, a first semiconductor portion including a first channel layer containing a majority carrier of a first conductivity type;
forming, over the first semiconductor portion, a separation layer having (i) an electron trap center to trap electrons, the electron trap center being lower than a boundary of a conduction band of the separation layer by 0.25 eV or more, and (ii) a hole trap center to trap holes, the hole trap center being higher than a boundary of a valence band of the separation layer by 0.25 eV or more; and
forming, over the separation layer, a second semiconductor portion including a second channel layer containing a majority carrier of a second conductivity type opposite to the first conductivity type, wherein
the electron trap center and the hole trap center are formed by doping the separation layer with a butylether gas containing an oxygen atom.

15. The method as set forth in claim 14 of producing a semiconductor wafer, further comprising
forming, over the first semiconductor portion, an etching stop layer that is configured such that the etching rate of the etching stop layer under a prescribed etching condition is lower than the etching rate of the separation layer.

16. The method of producing the semiconductor wafer as claimed in claim 14, wherein forming the separation layer includes forming, by epitaxial growth, the separation layer by loading the butylether gas containing the oxygen atom in addition to a Group 3 element source and a Group 5 element source gas into a reaction chamber and heating the base wafer.

17. The method of producing the semiconductor wafer as claimed in claim 14, wherein forming the separation layer includes forming, by epitaxial growth, the separation layer by loading the butylether gas containing the oxygen atom into a reaction chamber and heating the base wafer.

18. The method of producing the semiconductor wafer as claimed in claim 14, wherein forming the separation layer includes forming, by epitaxial growth, $Al_yGa_{1-y}As$, as the separation layer, by loading trimethylgallium and trimethylaluminum as a Group 3 element source, arsine as a Group 5 element source gas, and the butylether gas containing the oxygen atom into a reaction chamber, and heating the base wafer.

* * * * *